(12) United States Patent
Chen et al.

(10) Patent No.: US 6,909,136 B2
(45) Date of Patent: Jun. 21, 2005

(54) TRENCH-CAPACITOR DRAM CELL HAVING A FOLDED GATE CONDUCTOR

(75) Inventors: Yinan Chen, Taipei (TW); Ming-Cheng Chang, Tao-Yuan Hsien (TW); Jeng-Ping Lin, Tao-Yuan (TW); Tse-Yao Huang, Taipei (TW); Change-Rong Wu, Taipei Hsien (TW); Hui-Min Mao, Taipei (TW)

(73) Assignee: Nanya Technology Corp., Tao-Yuan Hsien (TW)

( * ) Notice: Subject to any disclaimer, the term of this patent is extended or adjusted under 35 U.S.C. 154(b) by 169 days.

(21) Appl. No.: 10/604,344

(22) Filed: Jul. 14, 2003

(65) Prior Publication Data

US 2005/0012131 A1 Jan. 20, 2005

(51) Int. Cl.[7] .............................................. H01L 21/108
(52) U.S. Cl. ..................... 257/301; 257/302; 257/304; 257/305; 438/242; 438/243
(58) Field of Search ................................. 257/301, 304, 257/313, 532, 302, 305; 438/342, 386

(56) References Cited

U.S. PATENT DOCUMENTS 6,355,954 B1 * 3/2002 Gall et al. ................... 257/297
6,399,977 B1 * 6/2002 Alsmeier .................... 257/301

* cited by examiner

Primary Examiner—David Nelms
Assistant Examiner—Long Tran
(74) Attorney, Agent, or Firm—Winston Hsu

(57) ABSTRACT

A novel trench-capacitor DRAM cell structure is disclosed. The trench-capacitor DRAM cell of this invention includes an active area island having a horizontal semiconductor surface and a vertical sidewall contiguous with the horizontal semiconductor surface. A pass transistor is disposed at the corner of the active area island. The pass transistor includes a folded gate conductor strip extending from the horizontal semiconductor surface to the vertical sidewall of the active area island, a source formed in the horizontal semiconductor surface, a drain formed in the vertical sidewall, and a gate oxide layer underneath the folded gate conductor strip. The source and drain define a folded channel. The trench-capacitor DRAM cell further includes a trench capacitor that is insulated from the folded gate conductor strip by a trench top oxide (TTO) layer and is coupled to the pass transistor via the drain.

9 Claims, 18 Drawing Sheets

TRENCH-CAPACITOR DRAM CELL HAVING A FOLDED GATE CONDUCTOR

BACKGROUND OF INVENTION

1. Field of the Invention

The present invention relates to a semiconductor memory device. More particularly, the present invention relates to a trench-capacitor dynamic random access memory (DRAM) with a folded gate conductor and method of fabrication thereof.

2. Description of the Prior Art

A memory chip is an integrated circuit (IC) made of millions of transistors and capacitors. In the most common form of computer memory, dynamic random access memory (DRAM), a MOS transistor and a storage capacitor are paired to create a memory cell, which represents a single bit of data. Memory cells are etched onto a silicon wafer in an array of columns (bitlines) and rows (wordlines). The intersection of a bitline and wordline constitutes the address of the memory cell. The storage capacitor holds the bit of information. The MOS transistor acts as a switch that lets the control circuitry on the memory chip read the storage capacitor or change its state. The storage capacitor typically comprises a top electrode, a storage node, and a capacitor dielectric layer.

DRAM devices having deep trench (DT) capacitors are well known in the art. In the case of DRAM, in order to fabricate a lot of memory cells in the same memory device, the base area of the memory cells must be small. At the same time, the electrode plates of the capacitors of the memory cells must have sufficient surface area to store enough charge. Because cell size determines chip density, size and cost, reducing cell area is the DRAM designer's primary goal. Cell area may be reduced by shrinking the individual feature size, or by forming structures, which make more efficient use of the chip surface area. The latter approach is particularly desirable. In a typical process for fabricating trench-capacitor DRAMs, the capacitor structure is completely formed prior to the formation of the transistor gate conductor (GC) structure. Thus, a typical process sequence involves the steps of opening the trench, filling the trench, forming the node conductors, then forming the gate stack structure.

SUMMARY OF INVENTION

It is the primary object of the present invention to provide a novel semiconductor memory device and method of fabrication.

According to the claimed invention, a trench-capacitor DRAM cell is provided. The trench-capacitor DRAM cell includes an active area island comprising a horizontal surface and a vertical surface. A pass transistor is disposed at a corner portion of the active area island. The pass transistor includes a folded gate conductor extending from the horizontal surface of the active area island to the vertical surface. A source doped region is situated in the horizontal surface of the active area island. A drain doped region is situated in the vertical surface of the active area island. A trench capacitor is formed below the folded gate conductor and isolated from the folded gate conductor with an insulation layer. The trench capacitor is electrically connected to the pass transistor through the drain doped region.

Other objects, advantages, and novel features of the claimed invention will become more clearly and readily apparent from the following detailed description when taken in conjunction with the accompanying drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 18:
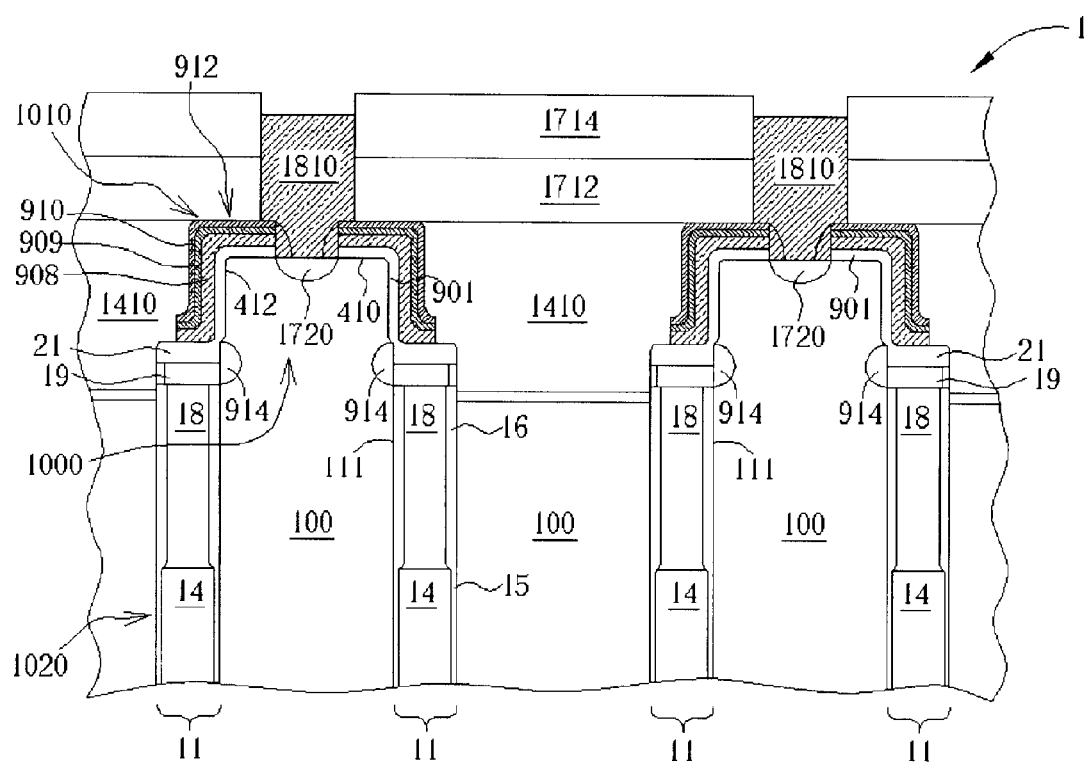
FIG. 18 is a schematic cross-sectional diagram showing the trench-capacitor DRAM cell with a folded gate conductor (GC) according to one preferred embodiment of the present invention.

Please refer to FIG. 18. FIG. 18 is a schematic cross-sectional diagram showing the trench-capacitor DRAM cell with a folded gate conductor (GC) according to one preferred embodiment of the present invention. The trench-capacitor DRAM cell comprises an active area island 1000 having a horizontal surface 410 and a vertical surface 412. A pass transistor 1010 is disposed at a corner portion of the active area island 1000. The pass transistor 1010 comprises a folded gate structure 911 extending from the horizontal surface 410 down to the vertical surface 412 of the active area island 1000. A source doped region 1720 is formed in the horizontal surface 410 of the active area island 1000 and is located next to one end of the folded gate structure 911. A drain doped region 914 is formed in the vertical surface 412 of the active area island 1000 and is located next to the other end of the folded gate structure 911. A gate oxide layer 901 is interposed between the folded gate structure 911 and the active area island 1000. The source doped region 1720 and the drain doped region 914 define a folded channel at the corner portion of the active area island 1000. The trench-capacitor DRAM cell further comprises a trench capacitor 1020 electrically connected to the pass transistor 1010 through the drain doped region 914. The trench capacitor 1020 is disposed below the folded gate structure 911 and is isolated from the folded gate structure 911 with a trench top oxide (TTO) layer 21. According to one preferred embodiment of the present invention, the folded gate structure 911 comprises a polysilicon layer 908 and a silicon nitride cap layer 910.

One preferred method for fabricating the trench-capacitor DRAM cell with a folded gate conductor (GC) as set forth in FIG. 18 will now be described with reference to FIGS. 1–18.

Figure 1:
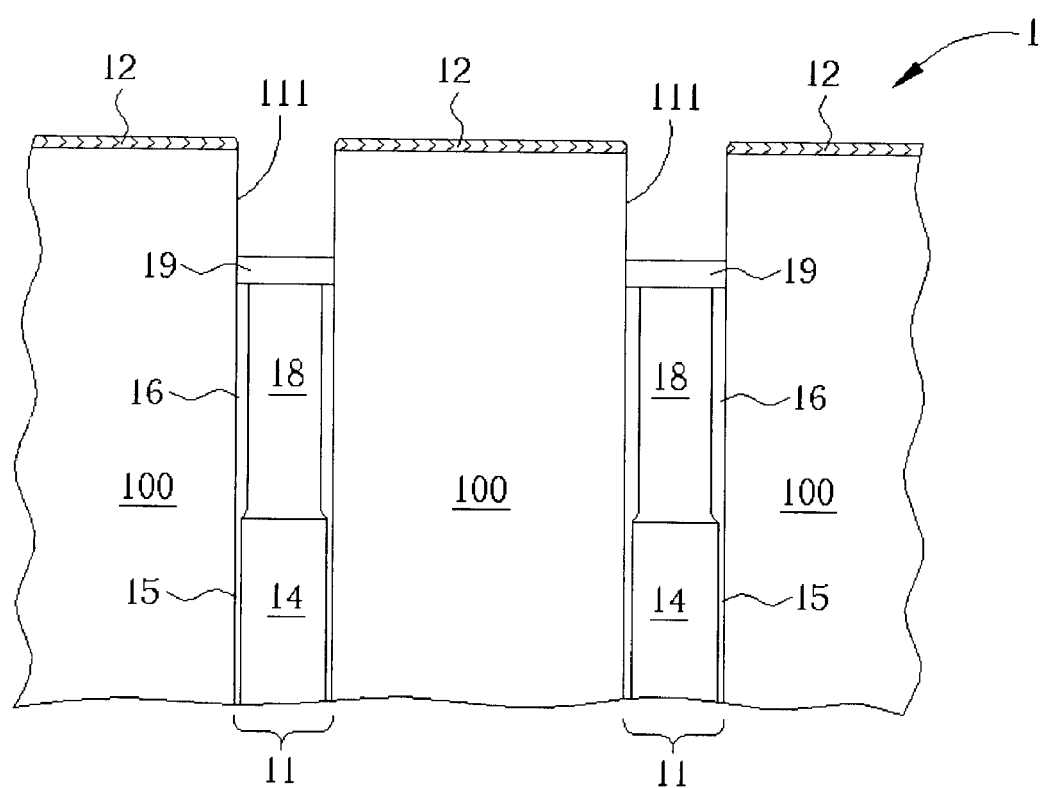
FIG. 1 is schematic cross-sectional diagram showing the semiconductor substrate after the formation of deep trench capacitors according to the preferred embodiment of the present invention.

Referring to FIG. 1, a plurality of deep trench structures 11 are formed in a memory area 1 of a semiconductor substrate 100. Each of the deep trench structures 11 comprises a collar oxide layer 16 at an upper portion of the deep trench structures 11 and a deep trench capacitor structure at a lower portion of the deep trench structures 11. For the sake of simplicity, the lower portions of the deep trench capacitor structure are omitted, and only the capacitor dielectric layer 15 and a portion of the storage node 14 of the deep trench capacitor are shown through FIGS. 1–18. The formation of the deep trench structure 11 is known in the art. A patterned pad layer 12 is formed on the semiconductor substrate 100. Using the pad layer 12 as an etching mask, a conventional anisotropic dry etching process such as a reactive ion etching (RIE) process is carried out to etch into the semiconductor substrate 100 to form deep trenches 111. The pad layer 12 may be a pad nitride, a pad oxide, or a nitride/oxide stack, but not limited thereto. The patterning of the pad layer 12 may be completed by conventional lithography and etching processes.

Subsequently, a conventional chemical vapor deposition (CVD) and an etching process are carried out to form a first conductive layer 14 at the lower portion of the deep trench 111. Preferably, the first conductive layer 14 is an N type doped polysilicon layer serving as a storage node of the deep trench capacitor. In another case, the first conductive layer 14 may be a metal layer. It is understood that a capacitor dielectric layer 15 is formed on sidewall of the deep trench 111 prior to the formation of the first conductive layer 14. The formation of the capacitor dielectric layer 15 is known in the art and the details thereof are therefore omitted for simplicity. A collar oxide layer 16 is then formed at an upper portion of the deep trench 111.

Still referring to FIG. 1, a second conductive layer 18 such as an N type doped ploysilicon layer is deposited on the first conductive layer 14. In the preferred embodiment of the present invention, the second conductive layer 18 is made of N type doped ploysilicon that is formed by conventional CVD methods. The collar oxide layer 16 on the sidewalls of the deep trench structure 111 is selectively etched. The exposed top surface of the collar oxide layer 16 may be coplanar with the top surface of the second conductive layer 18. Or, the exposed top surface of the collar oxide layer 16 may be slightly lower than the top surface of the second conductive layer 18. The selective etching of the collar oxide layer 116 may be completed by wet chemistry that does not affect the second conductive layer 18. For example, HF based wet etching or BOE. A third conductive layer 19 such as non-doped polysilicon is deposited over the second conductive layer 18. The third conductive layer 19 provides a diffusion path for dopants in the second polysilicon layer 18. Through the third conductive layer 19, the dopants such as arsenic or phosphorus out-diffuse to the neighboring substrate body in the subsequent thermal processes. Preferably, the third conductive layer 19 has a thickness of about 50 angstroms to 150 angstroms. The third conductive layer 19 made of non-doped polysilicon may be formed by conventional CVD and etching methods.

Figure 2:
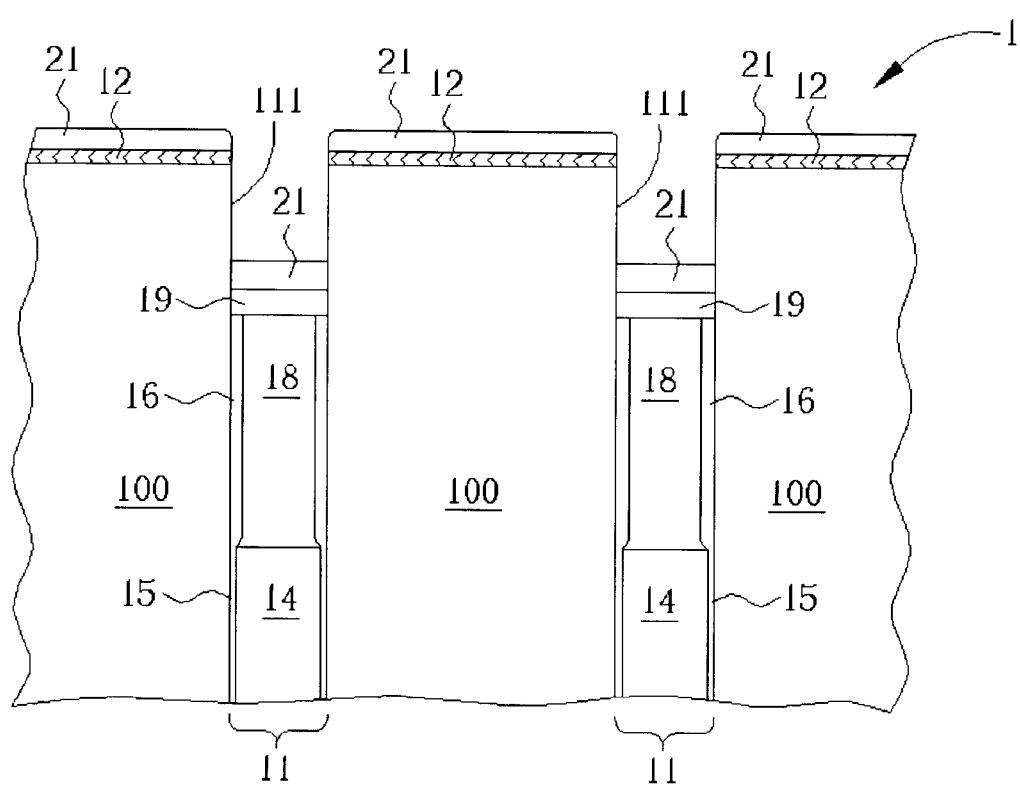
FIG. 2 is schematic cross-sectional diagram showing the semiconductor substrate after the formation of TTO layer according to the preferred embodiment of the present invention.

Referring to FIG. 2, a high-density plasma CVD (HDPCVD) process is carried out to deposit a HDP oxide layer (not shown) at the bottom, sidewalls of the deep trench structure 111, and on the top of the pad layer 12. The HDP oxide layer on the sidewalls of the deep trench structure 111 is much thinner than the HDP oxide layer at the bottom of the deep trench structure 111. Thereafter, an isotropic dry or wet etching is performed to remove the thin HDP oxide layer on the sidewalls of the deep trench structure 111, leaving a thickness of the HDP oxide layer at the bottom of the deep trench structure 111. The remaining HDP oxide layer atop the third polysilicon layer 19 is referred to as a Trench Top Oxide (TTO) layer 21. Preferably, the TTO layer 21 has a thickness of about 200 angstroms to 400 angstroms.

Figure 3:
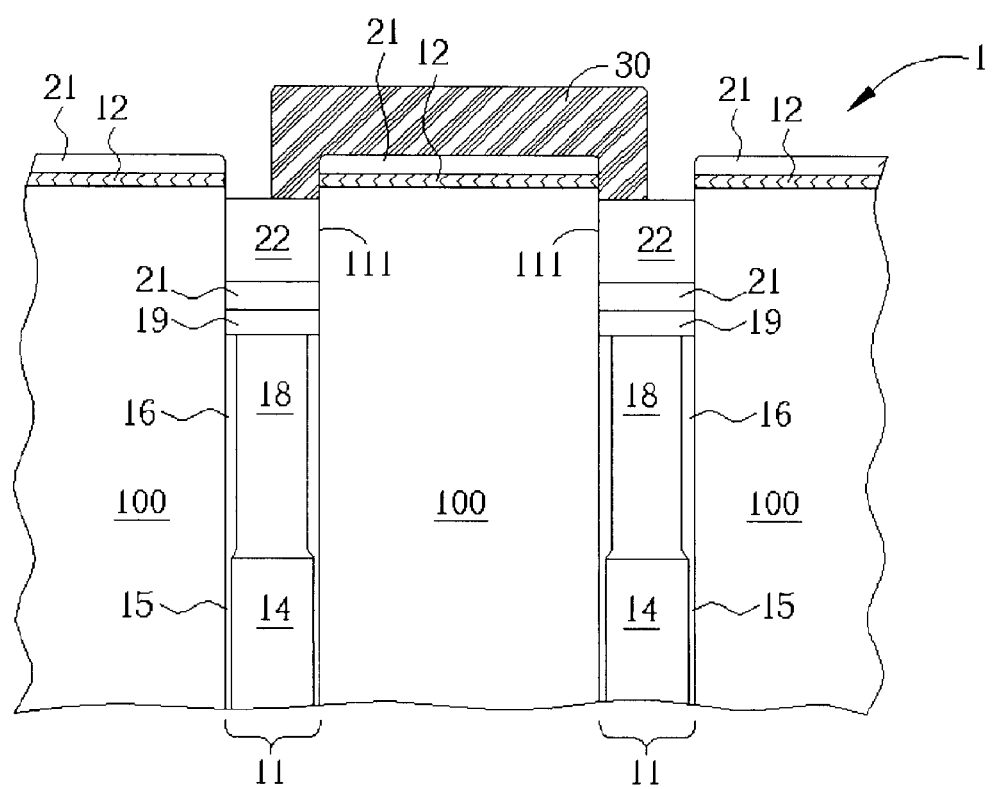
FIG. 3 is schematic cross-sectional diagram showing the semiconductor substrate after the formation of sacrificial layer on the TTO layer and the coating of the photoresist defining active area islands according to the preferred embodiment of the present invention.

Referring to FIG. 3, a sacrificial layer 22 is then deposited on the TTO layer 21 at an upper portion of the deep trench 111. Preferably, the sacrificial layer 22 is made of anti-reflection coating (ARC) materials such as silicon oxynitride (SiON). As indicated, the sacrificial layer 22 is stuck in the deep trench 111. The method of forming the sacrificial layer 22 includes the steps of depositing a layer of anti-reflection coating over the substrate 100 and in the deep trench 111, and then etching back the anti-reflection coating to expose the HDP oxide layer outside the deep trench. Thereafter, a patterned photoresit layer 30 is formed on the substrate 100 to define active area islands on the substrate 100.

Figure 4:
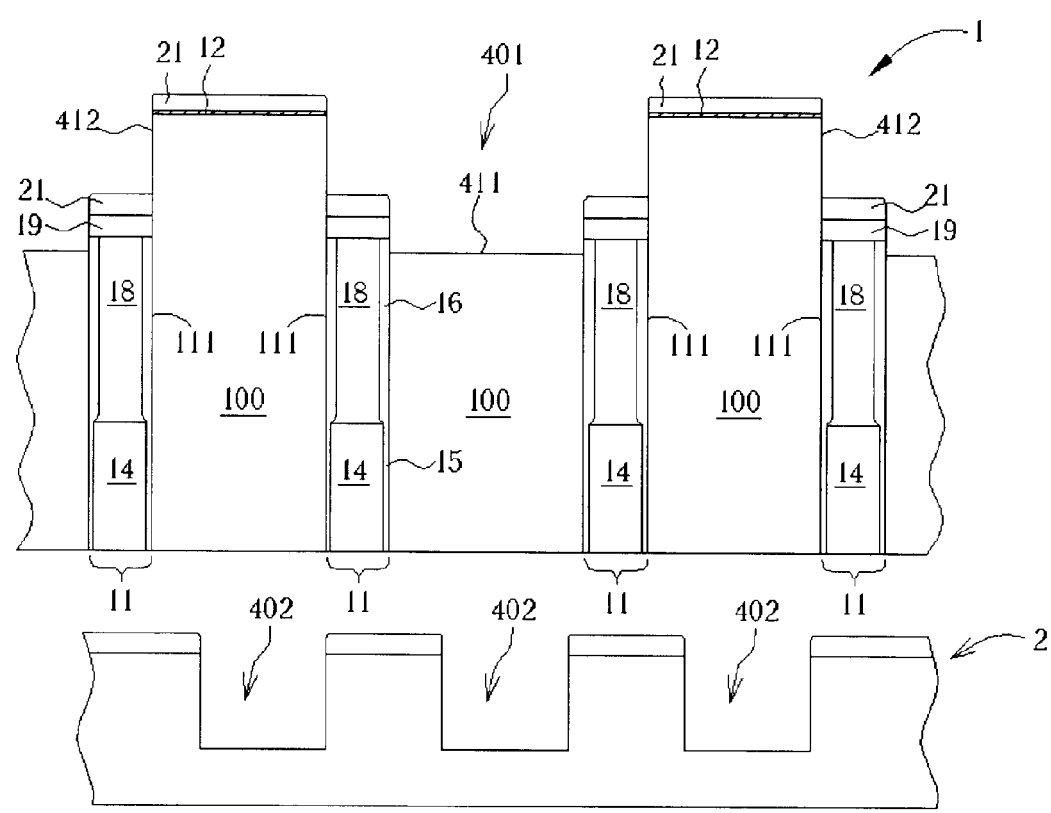
FIG. 4 is schematic cross-sectional diagram showing the semiconductor substrate after the formation of recess regions in the memory area and shallow trenches in the peripheral circuit area according to the preferred embodiment of the present invention.

Referring to FIG. 4, using the photoresist layer 30 and the sacrificial layer 22 as an etching mask, a dry etching process is carried out to etch non-masked areas on the substrate 100 so as to form recess region 401. It is noted that a plurality of isolation trenches 402 are also formed in the peripheral circuit area 2 of the substrate 100. The photoresist layer 30 and the sacrificial layer 22 are then removed. According to the preferred embodiment of the present invention, the recess region 401 comprises a semiconductor substrate bottom 411 and semiconductor substrate sidewalls 412, and the level of the semiconductor substrate bottom 411 is lower than the third conductive layer 19. As indicated, a portion of the third conductive layer 19 is exposed.

Figure 5:
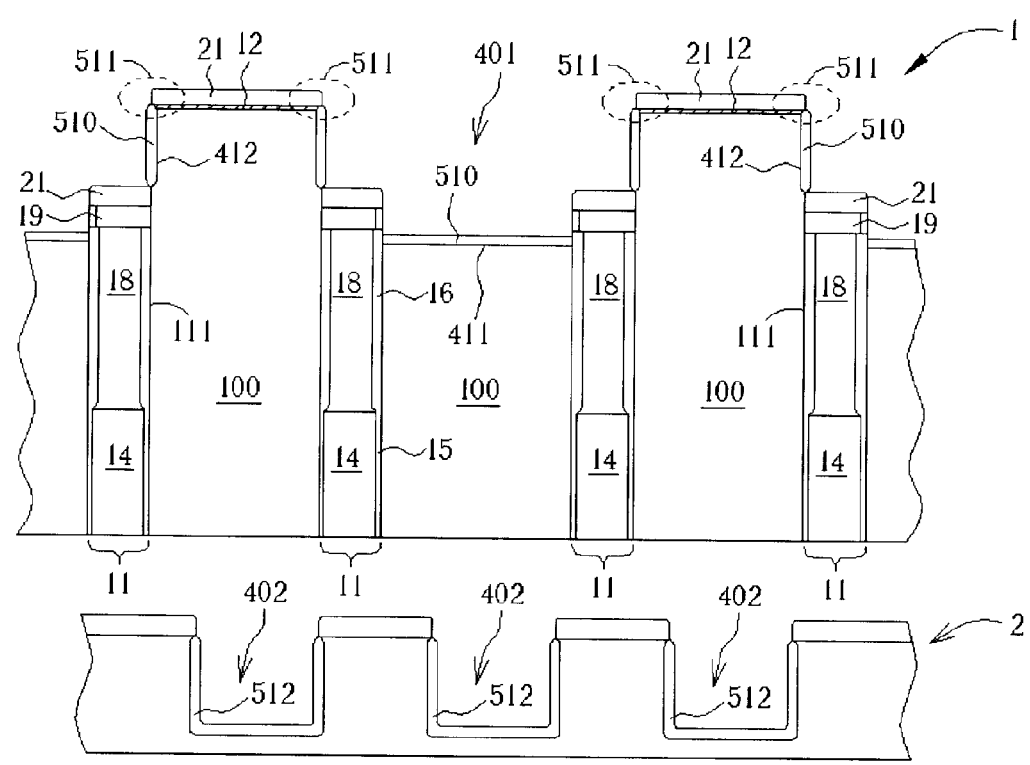
FIG. 5 is schematic cross-sectional diagram showing the semiconductor substrate after first corner rounding according to the preferred embodiment of the present invention.

Referring to FIG. 5, a thermal oxidation process is carried out to form a silicon dioxide layer 510 on the semiconductor substrate bottom 411 and semiconductor substrate sidewalls 412 in the recess region 412. The thermal oxidation process also corner rounding the semiconductor substrate indicated by dash line circle 511. This thermal oxidation process is thus also referred to as a first corner-rounding process. It is noted that an oxide liner 512 is also formed in the shallow trenches 402 in the peripheral circuit area 2 during the thermal oxidation process. It is further noted that the exposed third conductive layer 19 may be oxidized.

Figure 6:
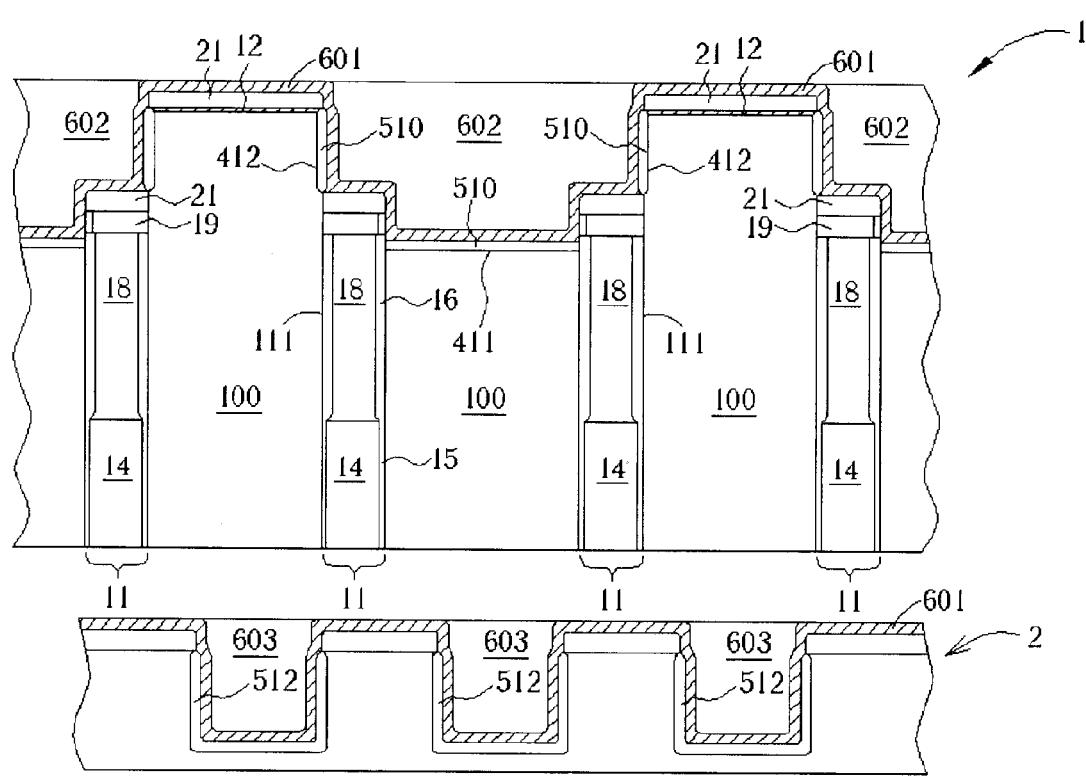
FIG. 6 is schematic cross-sectional diagram showing the semiconductor substrate after the formation of isolation layers in the recess regions and peripheral trenches according to the preferred embodiment of the present invention.

Referring to FIG. 6, a conformal nitride liner 601 is then deposited to cover the active areas and the interior surface of the recess regions 401, and cover the interior surface of the shallow trenches 402 in the peripheral circuit area 2. A conventional CVD process such as HDPCVD is then performed to deposited an insulating layer over the nitride liner 601 in the recess regions 401 and in the shallow trenches 402. The insulating layer is then planarized using chemical mechanical polishing (CMP) to form isolation structures 602 and 603. In the CMP process, the nitride liner 601 serves as a CMP stop layer.

Figure 7:
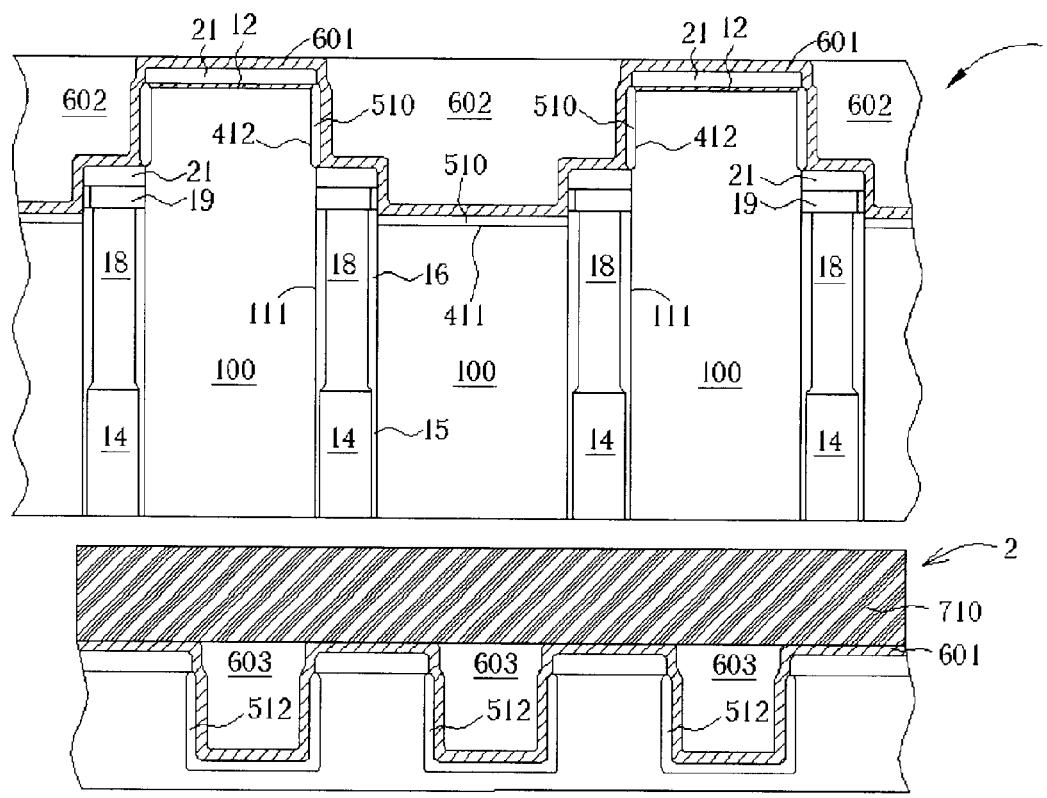
FIG. 7 is schematic cross-sectional diagram showing the semiconductor substrate after masking the peripheral circuit area according to the preferred embodiment of the present invention.
Figure 8:
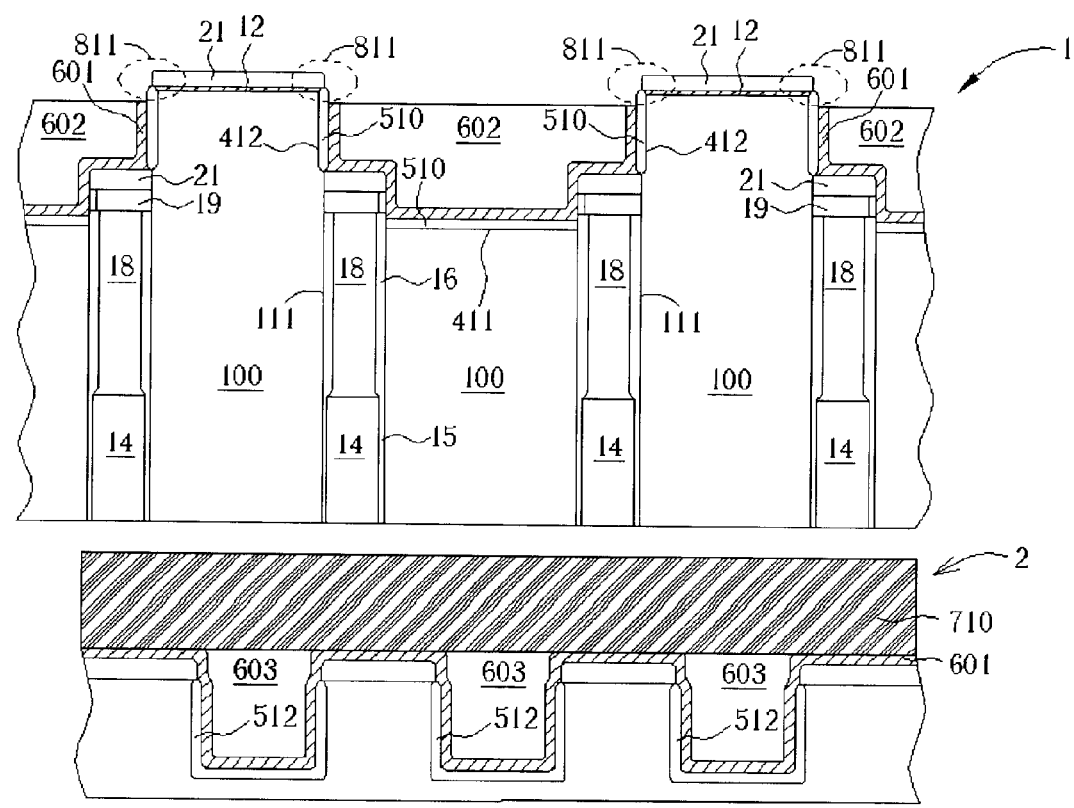
FIG. 8 is schematic cross-sectional diagram showing the semiconductor substrate after second corner rounding according to the preferred embodiment of the present invention.

Referring to FIG. 7, a photoresist layer 710 is coated on the substrate 100 to mask the peripheral circuit area 2. As shown in FIG. 8, a portion of the isolation structure 602, a portion of the nitride liner 601, and a portion of the pad layer 12 are removed to expose the corner portion of the active area island as indicated with dash line circle 811. Subsequently, a second corner-rounding process is carried out. The second corner-rounding process may be wet oxidation methods known in the art.

Figure 9:
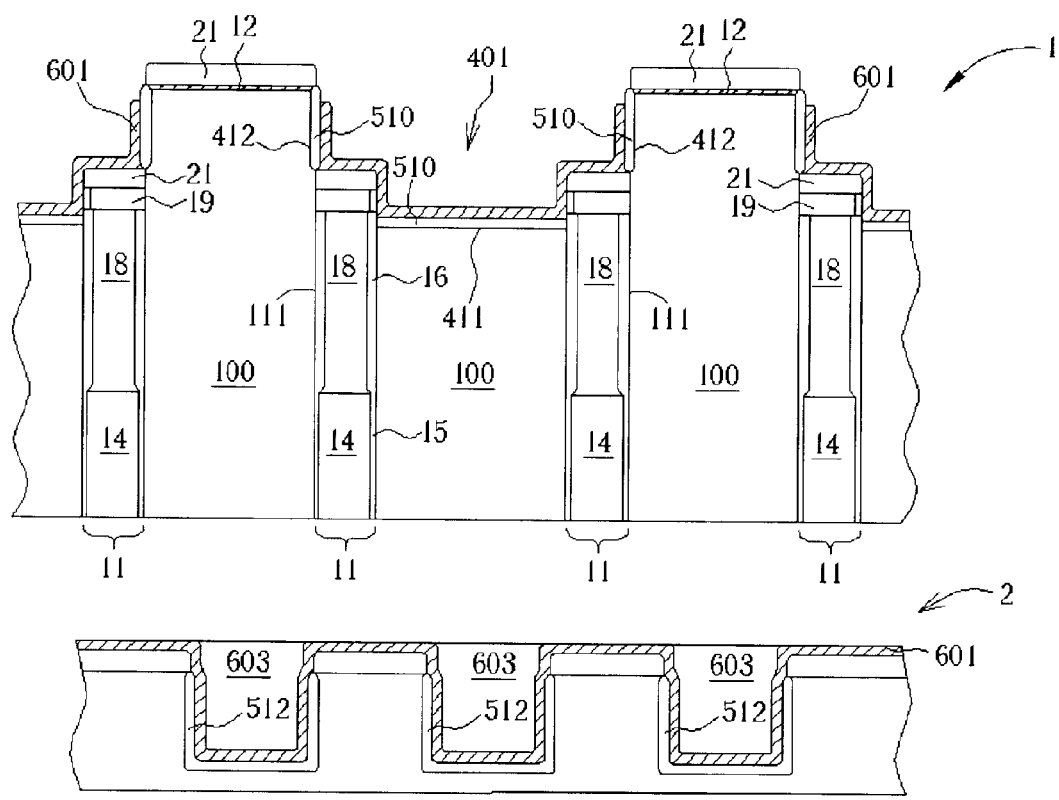
FIG. 9 is schematic cross-sectional diagram showing the semiconductor substrate after the removal of isolation layers in the recess regions according to the preferred embodiment of the present invention.
Figure 10:
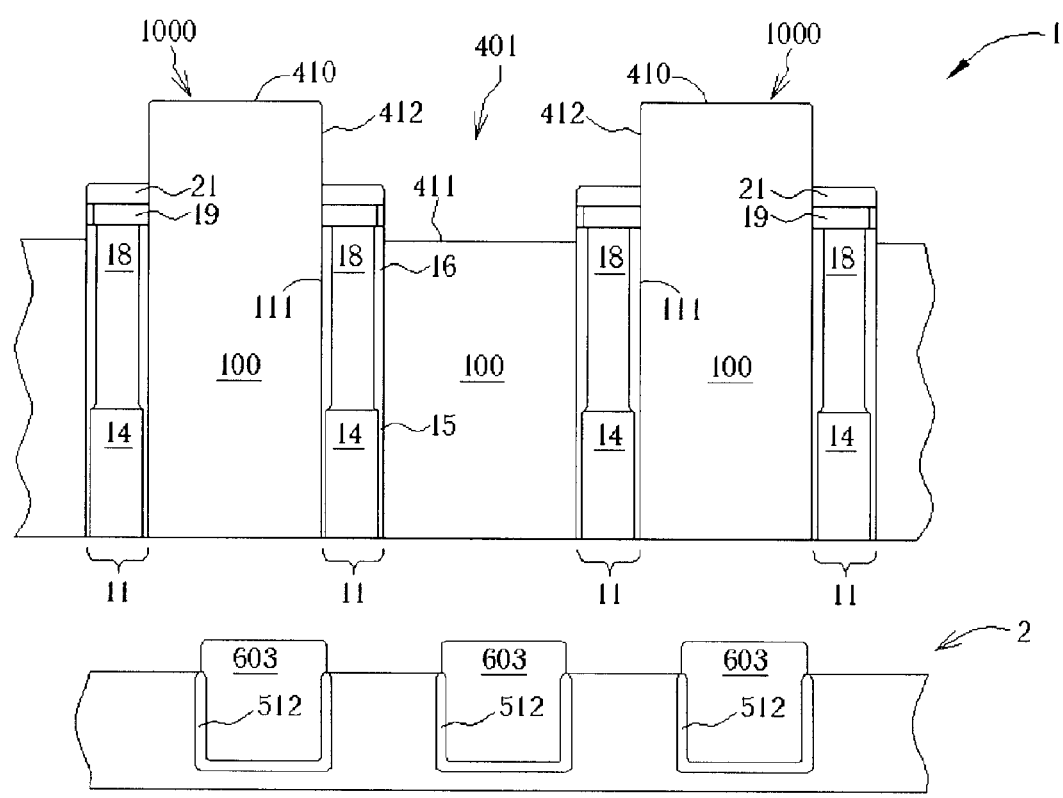
FIG. 10 is schematic cross-sectional diagram showing the semiconductor substrate with active area islands in the memory area according to the preferred embodiment of the present invention.

Referring to FIG. 9, the isolation layer 602 in the recess region 401 is then removed, while remaining the isolation layer 603 in the shallow trenches intact. After removing the isolation layer 602 in the recess region 401, the photoresist layer 710 masking the peripheral circuit area 2 is stripped. After this, referring to FIG. 10, the silicon nitride liner 601 and the pad layer 12 are removed. Thereafter, the silicon dioxide layer 510 previously formed on the semiconductor substrate bottom 411 and sidewalls 412 of the recess region 401 is removed, thereby forming an active area island 1000 having a horizontal surface 410 and a vertical surface 412.

Figure 11:
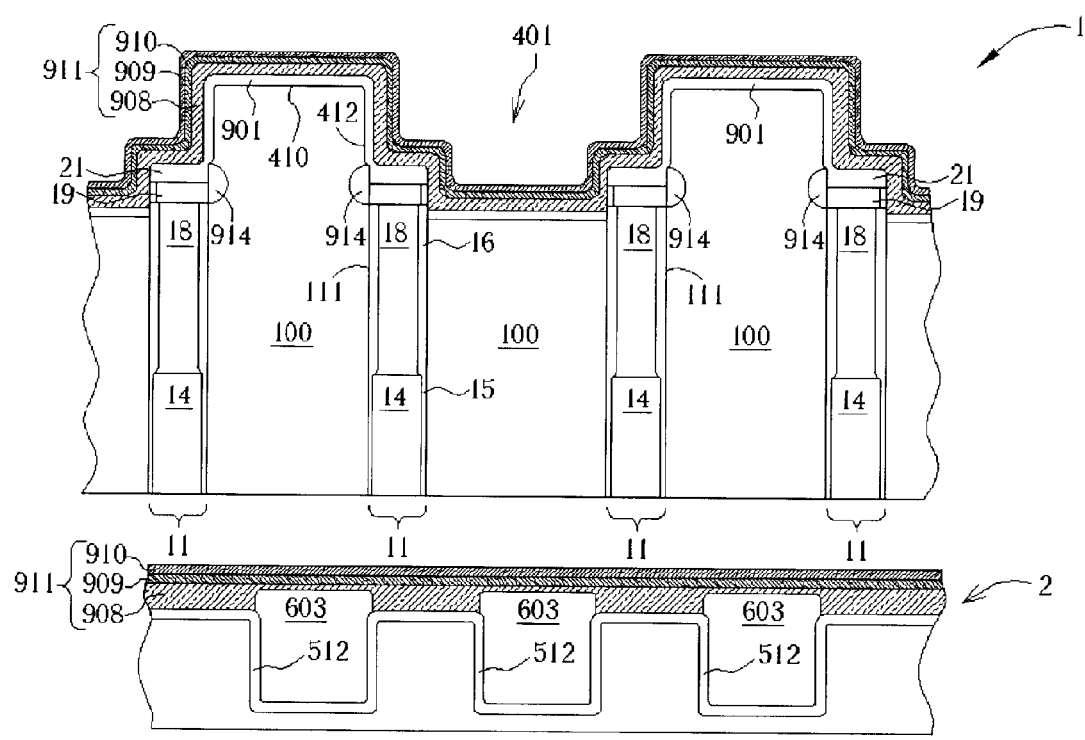
FIG. 11 is schematic cross-sectional diagram showing the semiconductor substrate with gate layer deposited thereon according to the preferred embodiment of the present invention.

Referring to FIG. 11, a gate oxide layer 901 is simultaneously formed on the horizontal surface 410 of the active area island, on the semiconductor substrate bottom 411 and sidewalls 412 of the recess region 401. A gate oxide layer 902 is also on the active areas of the peripheral circuit area 2. Dopants in the second conductive layer 18 out diffuse to the substrate 100 to form a source doped region 914. Optionally, before forming the gate oxide layers 901 and 902, it is appreciated that a pad oxide or sacrificial oxide layer may be formed in advance and then removed so that a gate oxide layer with a better quality may be obtained. After the formation of the gate oxide layers 901 and 902, a gate layer 911 is deposited on the substrate 100. The gate layer 911 comprises a polysilicon layer 908, a silicide layer 909 and a silicon nitride cap layer 910.

Figure 12:
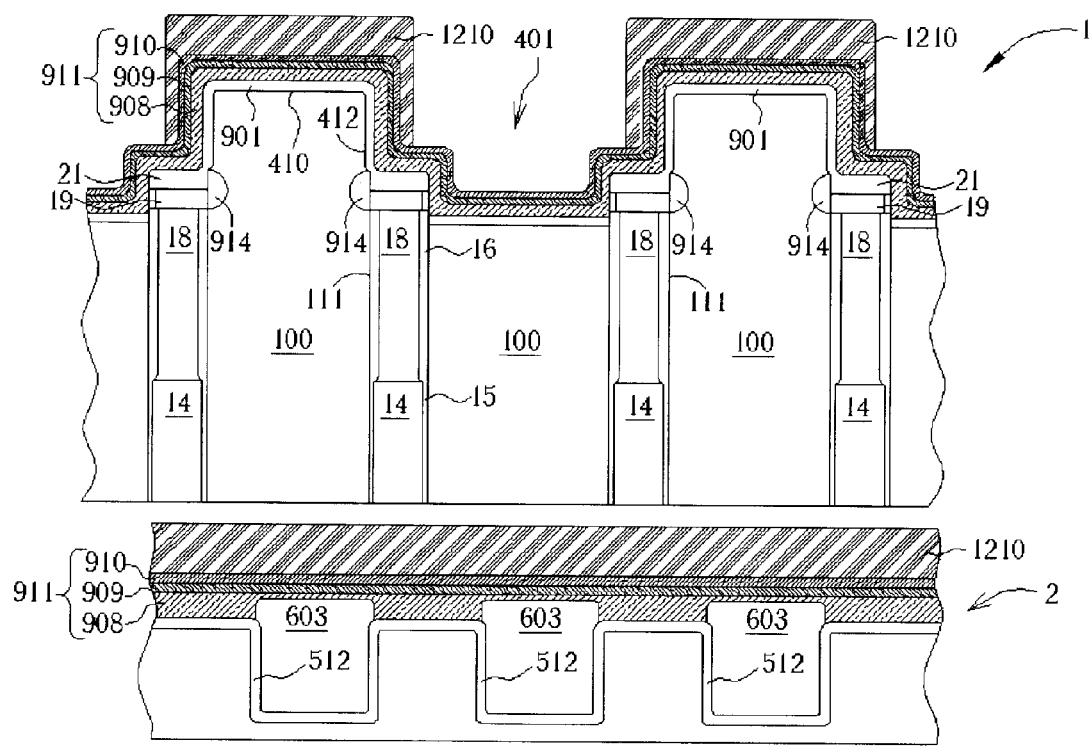
FIG. 12 is schematic cross-sectional diagram showing the semiconductor substrate coated by a photoresist defining gate structures in the memory area according to the preferred embodiment of the present invention.
Figure 13:
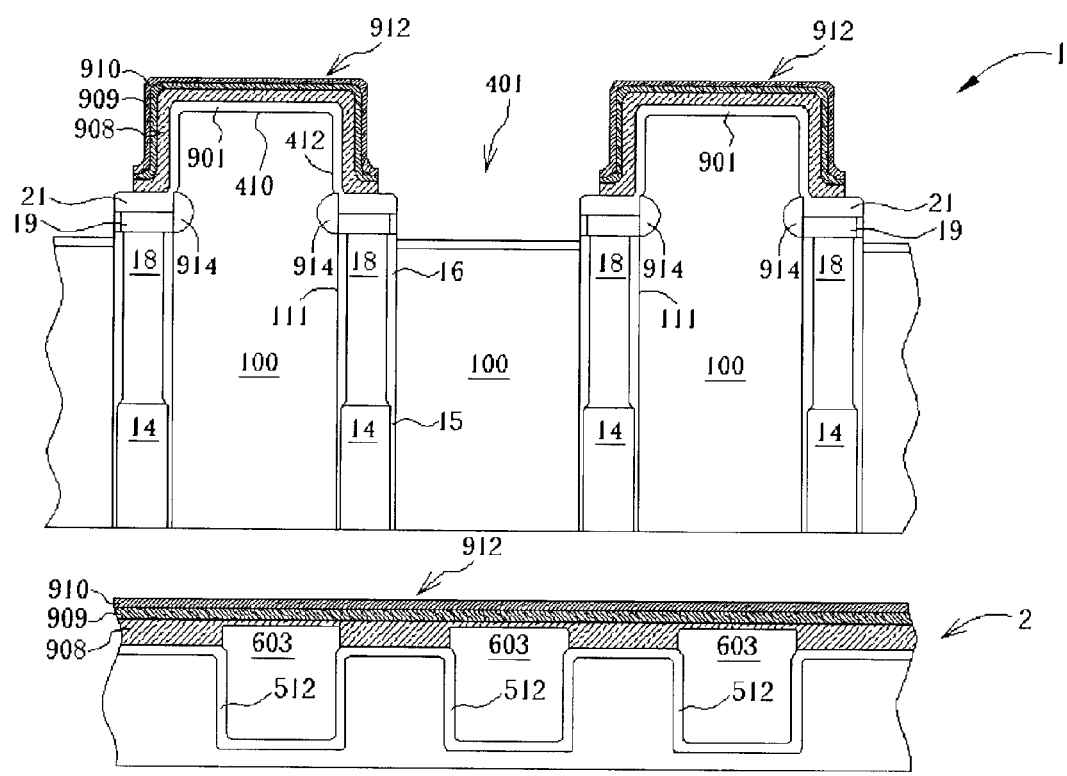
FIG. 13 is schematic cross-sectional diagram showing the semiconductor substrate after the formation of gate structures in the memory area according to the preferred embodiment of the present invention.

Referring to FIG. 12, a photoresist layer 1210 is formed on the gate layer 911. The photoresist layer 1210 defines the gate pattern of memory cells in the memory area 1 and transistors in the peripheral circuit area 2. Referring to FIG. 13, using the photoresist layer 1210 as an etching mask, a dry etching process is performed to etch the gate layer 911 so as to form gate structure 912. The photoresist layer 1210 is then removed.

Figure 14:
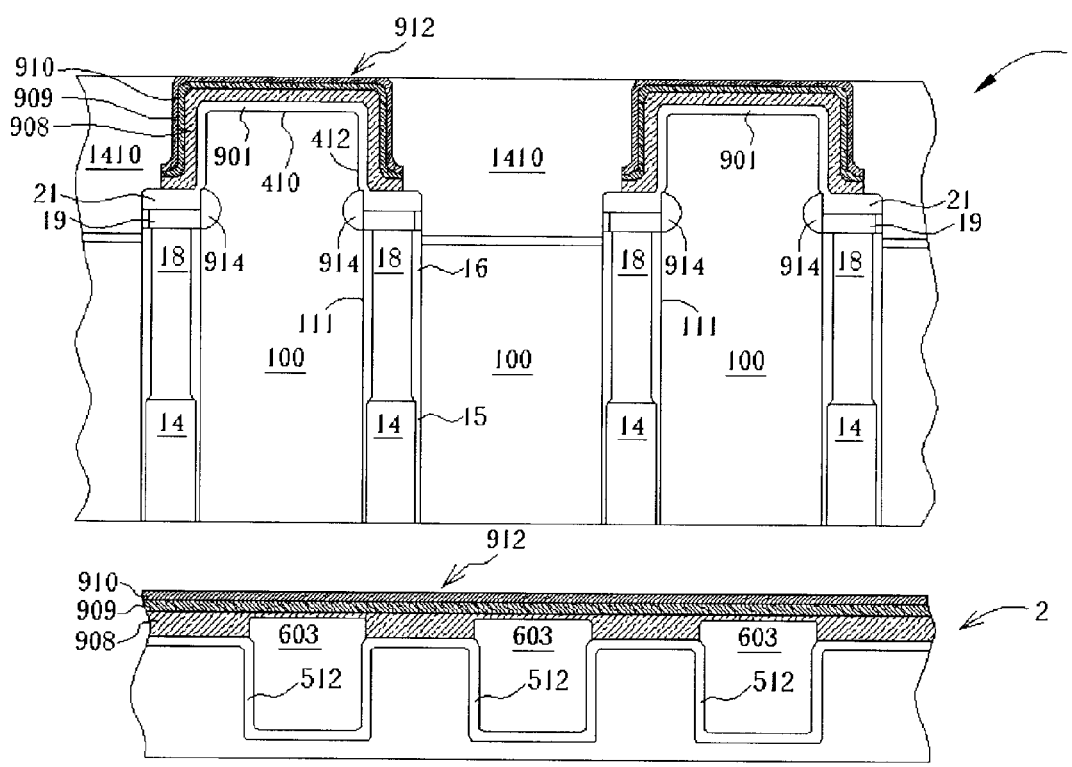
FIG. 14 is schematic cross-sectional diagram showing the semiconductor substrate after the formation of HDP oxide layer according to the preferred embodiment of the present invention.

Referring to FIG. 14, a HDPCVD process is carried out to deposit a HDP oxide layer 1410 on the substrate 100. The HDP oxide layer 1410 fills the recess region 401, and then planarized using CMP, stopping on the silicon nitride cap layer 910, thereby providing a planar surface.

Figure 15:
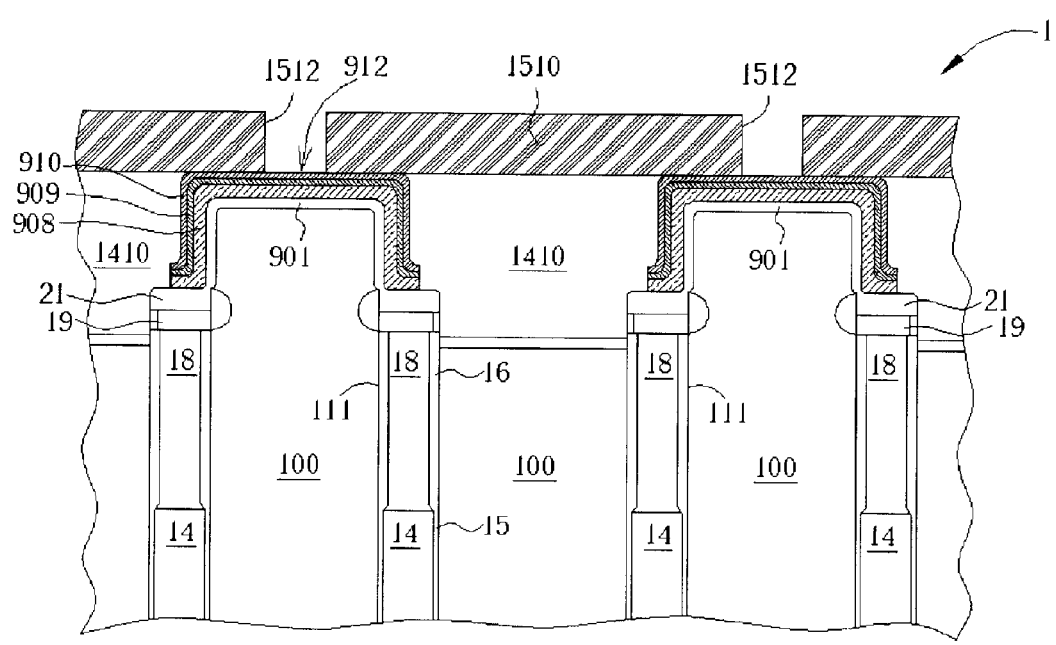
FIG. 15 is schematic cross-sectional diagram showing the semiconductor substrate coated by a photoresist layer defining bit line contact according to the preferred embodiment of the present invention.

Referring to FIG. 15, a photoresist layer 1510 is formed on the planar surface, more specifically, on the HDP oxide layer 1410 and the silicon nitride cap layer 910. The photoresist layer 1510 has an opening 1512 exposing a portion of the gate structure 912, where a bit line contact to be formed.

Figure 16:
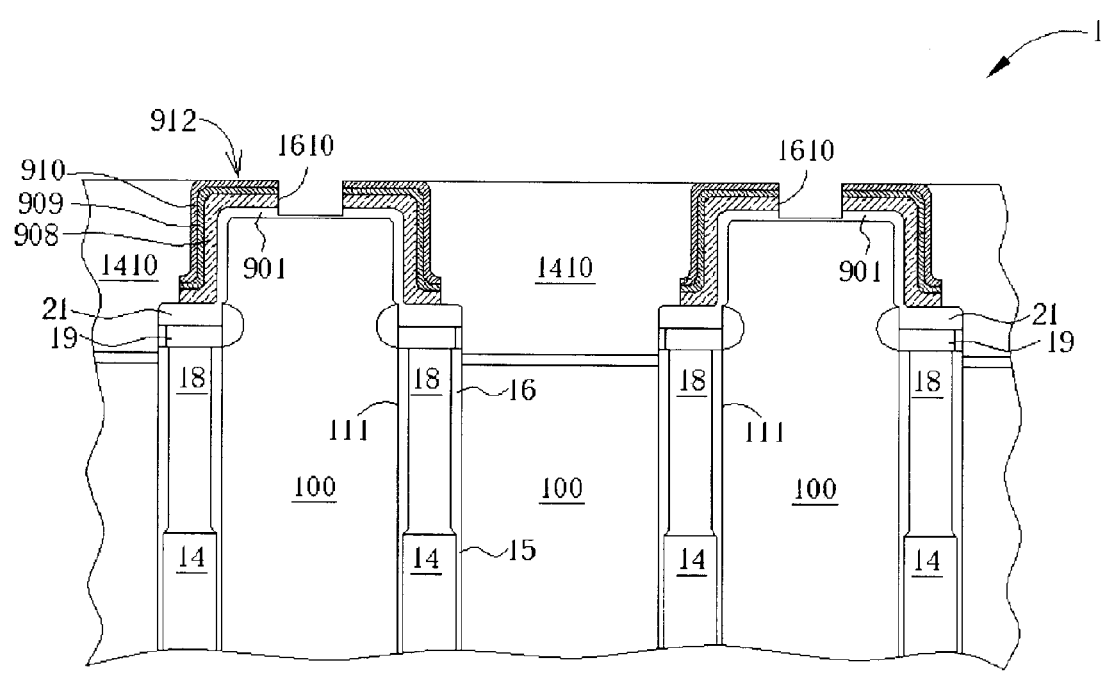
FIG. 16 is schematic cross-sectional diagram showing the semiconductor substrate after the formation of bit line contact according to the preferred embodiment of the present invention.

Referring to FIG. 16, a dry etching process is carried out to etch the gate structure 912 through the opening 1512 using the photoresist layer 1510 as an etching mask, thereby forming a bit line contact 1610. Etching stops on the gate oxide layer 901 to not expose the substrate 100. The photoresist layer 1510 is then removed.

Figure 17:
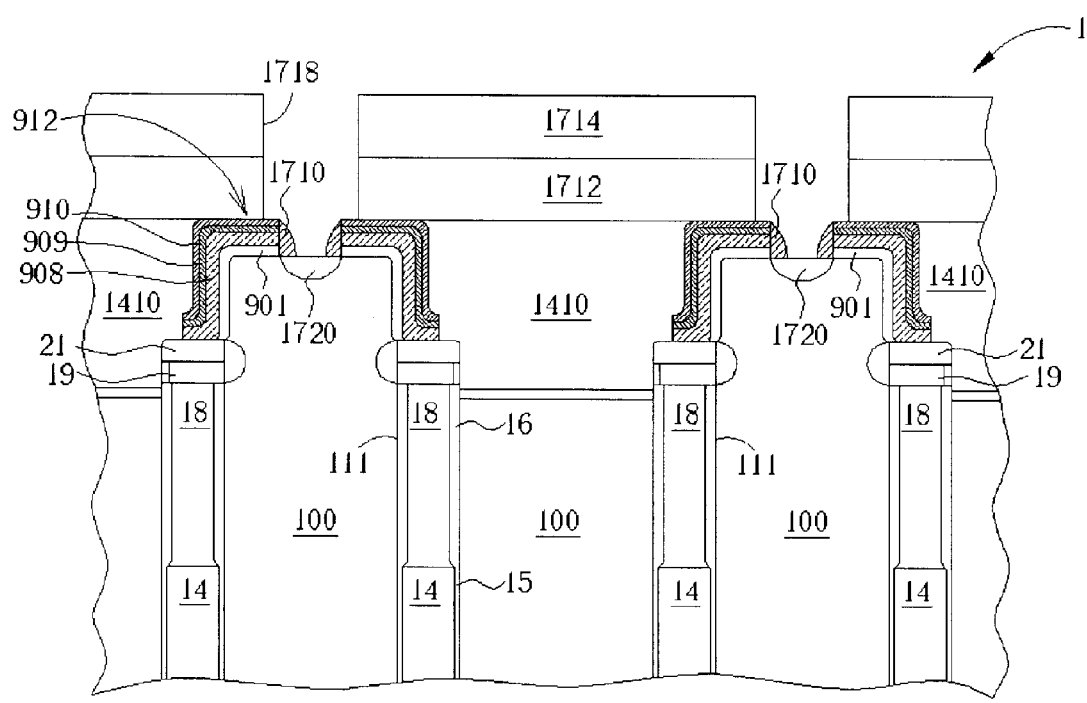
FIG. 17 is schematic cross-sectional diagram showing the semiconductor substrate after the formation of BPSG layer and TEOS layer according to the preferred embodiment of the present invention.

Referring to FIG. 17, silicon nitride spacers 1710 are formed on sidewalls of the bit line contact 1610. The method of forming the silicon nitride spacers 1710 includes the steps of depositing a thin silicon nitride layer on the substrate, and then anisotropically etching the silicon nitride layer. Subsequently, a borophos-phosilicate glass (BPSG) layer 1712 and a tetra-ethyl-ortho-silicate (TEOS) layer 1714 are deposited on the substrate. Conventional lithographic and etching processes are then performed to form an opening 1718 above the bit line contact 1610. Optionally, a CMP process may be carried out on the BPSG layer 1712 prior to the deposition of the TEOS layer 1714. An ion implantation process is then performed to dope ions such as phosphorus into the horizontal surface of the active area island through the opening 1718 and bit line contact 1610, thereby forming the source doped region 1720.

Referring to FIG. 18, finally, a polysilicon layer 1810 is deposited on the substrate. The polysilicon layer 1810 fills the opening 1718 and bit line contact 1610 and serves as a contact plug.

Those skilled in the art will readily observe that numerous modifications and alterations of the present invention may be made while retaining the teachings of the invention. Accordingly, the above disclosure should be construed as limited only by the metes and bounds of the appended claims.

What is claimed is:

1. A trench-capacitor DRAM cell, comprising:
    an active area island comprising a horizontal surface and a vertical surface;
    a pass transistor comprising a folded gate conductor extending from the horizontal surface of the active area island to the vertical surface, a source doped region situated in the horizontal surface of the active area island, and a drain doped region situated in the vertical surface of the active area island; and a trench capacitor formed below the folded gate conductor and isolated from the folded gate conductor with an insulation layer, the trench capacitor being electrically connected to the pass transistor through the drain doped region.

2. The trench-capacitor DRAM cell of claim 1 wherein the folded gate conductor on the vertical surface of the active area island is covered by a dielectric layer.

3. The trench-capacitor DRAM cell of claim 2 wherein the dielectric layer is a high-density plasma CVD (HDPCVD) silicon oxide layer.

4. The trench-capacitor DRAM cell of claim 2 wherein the dielectric layer is substantially coplanar with a top surface of the folded gate conductor on the horizontal surface of the active area island.

5. The trench-capacitor DRAM cell of claim 1 wherein the folded gate conductor comprises a polysilicon layer and a silicon nitride cap layer.

6. The trench-capacitor DRAM cell of claim 1 wherein the folded gate conductor further extends from the vertical surface of the active area island to a top surface of the insulation layer.

7. The trench-capacitor DRAM cell of claim 1 wherein the insulation layer is made of HDPCVD oxide.

8. The trench-capacitor DRAM cell of claim 1 wherein the insulation layer is a trench top oxide (TTO) layer.

9. The trench-capacitor DRAM cell of claim 1 wherein the pass transistor further comprises a gate oxide layer disposed underneath the folded gate conductor.

* * * * *